United States Patent [19]

Shimoda

[11] Patent Number: 6,060,904
[45] Date of Patent: May 9, 2000

[54] LEVEL SHIFTER CIRCUIT CERTAINLY OPERABLE ALTHOUGH A POWER SUPPLY VOLTAGE IS A LOW VOLTAGE

[75] Inventor: Hiroshi Shimoda, Kanagawa, Japan

[73] Assignee: NEC Corporation, Tokyo, Japan

[21] Appl. No.: 09/190,447

[22] Filed: Nov. 13, 1998

[30] Foreign Application Priority Data

Nov. 13, 1997 [JP] Japan .................................... 9-311651

[51] Int. Cl.[7] .......................................... H03K 19/0175
[52] U.S. Cl. ............................ 326/68; 326/121; 326/83; 326/115
[58] Field of Search ................................ 326/68, 80, 81, 326/83, 86, 115, 119, 121

[56] References Cited

U.S. PATENT DOCUMENTS

| | | | |
|---|---|---|---|
| 5,510,731 | 4/1996 | Dingwall | 326/63 |
| 5,619,150 | 4/1997 | Briner | 327/55 |
| 5,736,869 | 4/1998 | Wei | 326/81 |
| 5,872,476 | 4/1998 | Mihara et al. | 326/81 |

*Primary Examiner*—Jon Santamauro
*Assistant Examiner*—Don Phu Le
*Attorney, Agent, or Firm*—Foley & Lardner

[57] ABSTRACT

In a level shifter circuit comprising two P-channel transistors (MP1, MP2), two N-channel transistors (MN1, MN2), two P-channel transistors (MP3, MP4) and two N-channel transistors (MN3, MN4) which are interposed the P-channel transistors (MP1, MP2) and the N-channel transistors (MN1, MN2), four P-channel transistors (MP7, MP8, MP9, MP10) are connected between node (#1, #2) and VCC/GND signal (IN2) in series to fix node potentials of the N-channel transistors (MN3, M4) to VCC/GND. Connected to the nodes (#1, #2), the P-channel transistors (NP9, MP10) have gates connected to GND as countermeasure of a breakdown voltage BVds. Connected to VCC/GND signal (IN2), the P-channel transistors (MP7, MP8) have gates which are directly connected to an input terminal (IN1) and an output terminal of an inverter (INV1), respectively.

26 Claims, 9 Drawing Sheets

LEVEL SHIFTER CIRCUIT CERTAINLY OPERABLE ALTHOUGH A POWER SUPPLY VOLTAGE IS A LOW VOLTAGE

BACKGROUND OF THE INVENTION

This invention relates to a level conversion circuit for use in a semiconductor integrated circuit and, in particular, to a level shifter circuit for carrying out a level conversion on a low level.

As is well known in the art, metal oxide semiconductor (MOS) transistors are classified into N-channel MOS transistors and P-channel MOS transistors. Each N-channel transistor is formed on a P-well substrate while each P-channel transistor is formed on an N-well substrate. In addition, each MOS transistor has gate, drain, and source electrodes. Each MOS transistor may have a backgate electrode which is generally connected to the source electrode thereof.

In the manner which will later be described in conjunction with FIGS. 3A through 3E in detail, a conventional level shifter circuit comprises an inverter, first through sixth P-channel MOS transistors, and first through fourth MOS transistors. The inverter inverts an input signal to produce an inverted input signal. The first P-channel MOS transistor has a source electrode supplied with a power supply voltage and a gate electrode supplied with the input signal. The second P-channel MOS transistor has a source electrode supplied with the power supply voltage and a gate electrode supplied with the inverted input signal. The first N-channel MOS transistor has a drain electrode connected to a first node, a gate electrode connected to a second node, and a source electrode supplied with a level shift variable voltage. The second N-channel MOS transistor has a drain electrode connected to the second node, a gate electrode connected to the first node, and a source electrode supplied with the level shift variable voltage.

The third P-channel MOS transistor is connected between a drain electrode of the first P-channel MOS transistor and an inverting output terminal. The third P-channel MOS transistor has a gate electrode supplied with a switching signal. The third P-channel MOS transistor serves as a first breakdown preventing arrangement for preventing the first P-channel MOS transistor from breaking down. The fourth P-channel MOS transistor is connected between a drain electrode of the second P-channel MOS transistor and a non-inverting output terminal. The fourth P-channel MOS transistor has a gate electrode supplied with the switching signal. The fourth P-channel MOS transistor acts as a second breakdown preventing arrangement for preventing the second P-channel MOS transistor from breaking down.

The third N-channel MOS transistor is between the first node (the drain electrode of the first N-channel MOS transistor) and the inverting output terminal. The third N-channel MOS transistor serves as a first gate destruction preventing arrangement for preventing the gate electrode of the first N-channel MOS transistor from destroying. The fourth N-channel MOS transistor is between the second node (the drain electrode of the second N-channel MOS transistor) and the non-inverting output terminal. The fourth N-channel MOS transistor acts as a second gate destruction preventing arrangement for preventing the gate electrode of the second N-channel MOS transistor from destroying.

The fifth P-channel MOS transistor has a source electrode supplied with the switching signal, a gate electrode connected to the second node, and a drain electrode connected to the first node. The sixth P-channel MOS transistor has a source electrode supplied with the switching signal, a gate electrode connected to the first node, and a drain electrode connected to the second node. A combination of the fifth and the sixth P-channel MOS transistors is operable as an accelerating arrangement for accelerating a switching speed for signals.

However, a problem arises in the conventional level shifter circuit when the power supply voltage is a low voltage. This is because a signal switching for inverted and non-inverted output signals does not occur in the conventional level shifter circuit although a switching of the input signal is carried out in the manner which will later become clear.

SUMMARY OF THE INVENTION

It is therefore an object of the present invention to provide a level shifter circuit which is capable of certainly operating although an operating power supply voltage is a low voltage.

Other objects of this invention will become clear as the description proceeds.

A level shifter circuit to which the present invention is applicable has an input terminal supplied with an input signal having a low level, a switching terminal supplied with a switching signal, an inverting output terminal for outputting an inverted output signal having inverse phase with the input signal, a non-inverting output terminal for outputting a non-inverted output signal having in phase with the input signal, a power supply terminal supplied with a power supply voltage, and a variable voltage terminal supplied with a level shift variable voltage for varying the low level of the input signal from a zero voltage to a predetermined negative voltage. The level shifter circuit carries out level conversion operation on the input signal in response to the switching signal. The level shifter circuit shifts a low level of the inverted output signal and the non-inverted output signal into the level shift variable voltage when the switching signal indicates a level shift.

According to an aspect of this invention, the above-mentioned level shifter circuit comprises an inverter, connected to the input terminal, for inverting the input signal. The inverter has an output terminal for producing an inverted input signal. A first P-channel transistor has a source electrode connected to the power supply terminal, a gate electrode connected to the input terminal, and a drain electrode. A second P-channel transistor has a source electrode connected to the power supply terminal, a gate electrode connected to the output terminal of said inverter, and a drain electrode. A first N-channel transistor has a source electrode connected to the variable voltage terminal, a drain electrode connected to a first node, and a gate electrode connected to a second node. A second N-channel transistor has a source electrode connected to the variable voltage terminal, a drain electrode connected to the second node, and a gate electrode connected to the first node. Connected between the drain electrode of the first P-channel transistor and the inverting output terminal, a first breakdown preventing arrangement prevents the first P-channel transistor from breaking down. Connected between the drain electrode of the second P-channel transistor and the non-inverting output terminal, a second breakdown preventing arrangement prevents the second P-channel transistor from breaking down. Connected to the first node, the switching terminal, and the inverting output terminal, a first gate destruction preventing arrangement prevents the gate electrode of the first N-channel transistor from destroying. Connected to the second node, the switching terminal, and the non-inverting output terminal, a second gate destruction preventing arrangement prevents the gate electrode of the second N-channel transistor from destroying. Connected between the first and the second nodes and the switching terminal, an accelerating arrangement accelerates a switching speed for signals. Connected to the input terminal, the switching terminal, and the first node, a first node potential fixing arrangement fixes a potential of the first node. Connected to the output terminal of the inverter, the switching terminal, and the second node, a second node potential fixing arrangement fixes a potential of the second node.

In the above-mentioned level shifter circuit, the first P-channel transistor, the first breakdown preventing arrangement, and the first gate destruction preventing arrangement may be omitted and the first node may be directly connected to inverting output terminal. In addition, the accelerating arrangement may be omitted.

DESCRIPTION OF THE PREFERRED EMBODIMENTS

Figure 1:
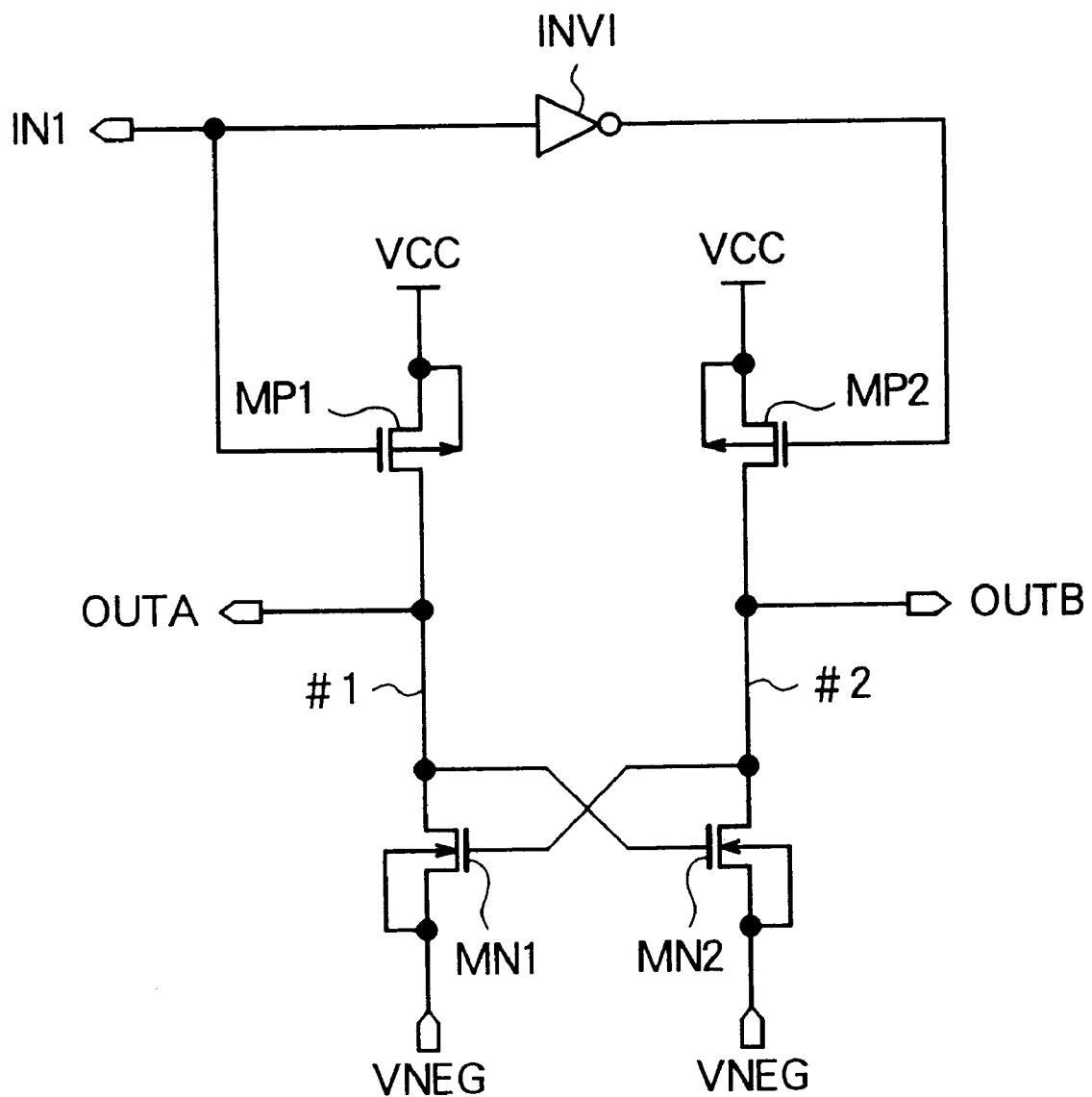
FIG. 1 is a circuit diagram of a basic level shifter circuit.

Referring to FIG. 1, a basic level shifter circuit for carrying out a level conversion on a low level will be described in order to facilitate an understanding of the present invention. In FIG. 1, a reference symbol IN1 indicates an input signal or an input terminal, a reference symbol OUTA indicates an inverting output signal or an inverting output terminal, and a reference symbol OUTB indicates a non-inverting output signal or a non-inverting output terminal. In addition, a reference symbol VCC indicates a power supply voltage or a power supply terminal and a reference symbol VNEG indicates a variable voltage terminal or a level shift variable voltage. The level shift variable voltage VNEG varies between a zero voltage and a predetermined negative voltage.

The illustrated level shifter circuit comprises an inverter INV1, first and second P-channel MOS transistors MP1 and MP2, and first and second N-channel MOS transistors MN1 and MN2. The inverter INV1 has an input terminal supplied with the input signal IN1, the inverter INV1 inverts the input signal IN1 to produce an inverted input signal by an output terminal thereof.

The first P-channel MOS transistor MP1 has a source electrode supplied with the power supply voltage VCC and a gate electrode supplied with the input signal IN1. The second P-channel MOS transistor MP2 has a source electrode supplied with the power supply voltage VCC and a gate electrode supplied with the inverted input signal from the inverter INV1. In addition, the first P-channel MOS transistor MP1 has a drain electrode connected to the inverting output terminal OUTA while the second P-channel MOS transistor MP2 has a drain electrode connected to the non-inverting output terminal OUTB.

The first N-channel MOS transistor MN1 has a drain electrode connected to a first node #1, a gate electrode connected to a second node #2, and a source electrode supplied with the level shift variable voltage VNEG. The second N-channel MOS transistor MN2 has a drain electrode connected to the second node #2, a gate electrode connected to the first node #1, and a source electrode supplied with the level shift variable voltage VNEG. That is, the first and the second N-channel MOS transistors MN1 and MN2 have the gate electrodes connected to the drain electrodes of the second and the first MOS transistors MN2 and MN1 in a cross fashion. The first node #1 is directly connected to the inverting output terminal OUTA while the second node #2 is directly connected to the non-inverting output terminal OUTB.

It will be assumed that the input signal IN1 is equal to the power supply voltage VCC in FIG. 1 In this event, the inverting output signal OUTA becomes the level shift variable voltage VNEG while the non-inverting output signal OUTB becomes the power supply voltage VCC. Attention will be directed to the first P-channel MOS transistor MP1. A potential difference between the N-well substrate and the drain electrode becomes |VCC|+|VNEG| and no action is taken on a junction withstand voltage of the transistor. Accordingly, the potential difference between the N-well substrate and the drain electrode drastically exceeds the junction withstand voltage of the first P-channel MOS transistor MP1 and destruction of the first P-channel MOS transistor MP1 may occur.

In addition, this holds for the N-channel MOS transistors. Attention will be directed to the second N-channel MOS transistor MN2. A potential difference between the P-well substrate and the drain electrode becomes |VCC|+|VNEG| and no action is taken on a junction withstand voltage of the transistor. In addition, attention will be directed to the first N-channel MOS transistor MN1. A potential difference between the gate electrode and the substrate becomes |VCC|+|VNEG| and no action is taken on a junction withstand voltage of the transistor. Accordingly, the potential difference between the gate electrode and the substrate drastically exceeds the junction withstand voltage of the first N-channel MOS transistor and destruction of gate electrode may occur.

It will presumed that the power supply voltage VCC is equal to 5 V and the level shift variable voltage VNEG is equal to −12 V. Under the circumstances, the level shifter circuit has a potential difference of 17 V that drastically exceeds a withstand voltage of a general transistor. In order to resolve such problems, a following proposal will be made in prior art.

Figure 2:
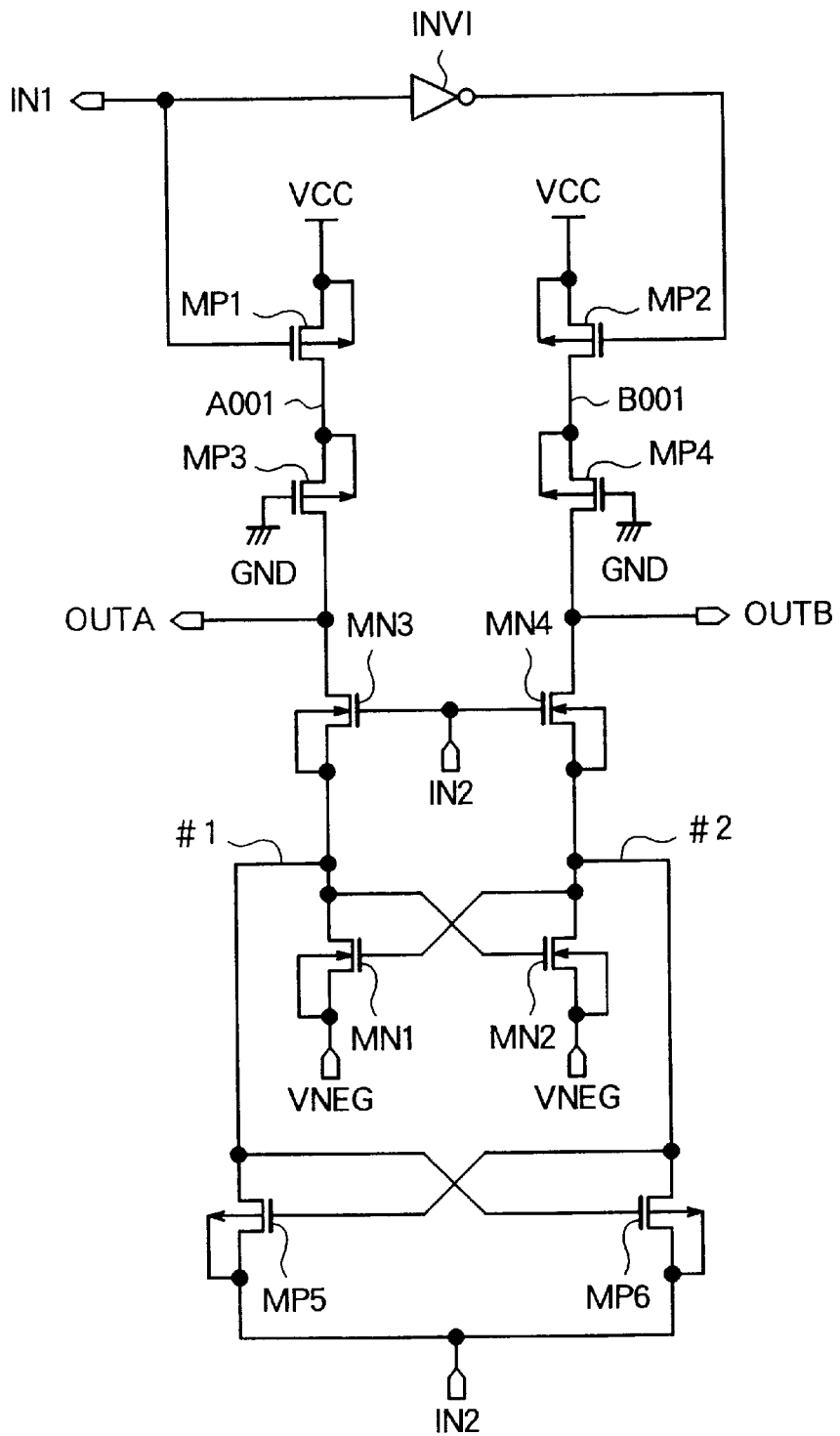
FIG. 2 is a circuit diagram of a conventional level shifter circuit.

FIG. 2 shows a conventional level shifter circuit for carrying out a level conversion on a low level. In this figure, a reference symbol IN1 indicates an input signal or an input terminal and a reference symbol IN2 indicates a switching signal or a switching terminal. In addition, a reference symbol OUTA indicates an inverting output signal or an inverting output terminal while a reference symbol OUTB indicates a non-inverting output signal or a non-inverting output terminal. Furthermore, a reference symbol VCC indicates a power supply voltage or a power supply terminal, a reference symbol VNEG indicates a level shift variable voltage or a variable voltage terminal, and a reference symbol GND indicates a grounding potential or a grounding (earth) terminal, namely, a zero voltage.

The illustrated level shifter circuit comprises not only the inverter INV1, the first and the second P-channel MOS transistors MP1 and MP2, and the first and the second N-channel MOS transistors MN1 and MN2 but also third through sixth P-channel MOS transistors MP3, MP4, MP5, and MP6 and third and fourth N-channel MOS transistors MN3 and MN4.

The third P-channel MOS transistor MP3 is connected between the drain electrode of the first P-channel MOS transistor MP1 and the inverting output terminal OUTA. More specifically, the third P-channel MOS transistor MP3 has a source electrode connected to the drain electrode of the first P-channel MOS transistor MP1, a gate electrode supplied with the grounding potential GND, and a drain electrode connected to the inverting output terminal OUTA. Likewise, the fourth P-channel MOS transistor MP4 is connected between the drain electrode of the second P-channel MOS transistor MP2 and the non-inverting output terminal OUTB. In particularly, the fourth P-channel MOS transistor MP4 has a source electrode connected to the drain electrode of the second P-channel MOS transistor MP2, a gate electrode supplied with the grounding potential GND, and a drain electrode connected to the non-inverting output terminal OUTB.

The third N-channel MOS transistor MN3 is connected between the drain electrode (the first node #1) of the first N-channel MOS transistor MN1 and the inverting output terminal OUTA. More specifically, the third N-channel MOS transistor MN3 has a source electrode connected to the drain electrode (the first node #1) of the first N-channel MOS transistor MN1, a gate electrode supplied with the switching signal IN2, and a drain electrode connected to the inverting output terminal OUTA. Similarly, the fourth N-channel MOS transistor MN4 is connected between the drain electrode (the second NODE #2) of the second N-channel MOS transistor MN2 and the non-inverting output terminal OUTB. In particularly, the fourth N-channel MOS transistor MN4 has a source electrode connected to the drain electrode (the second node #2) of the second N-channel MOS transistor MN2, a gate electrode supplied with the switching signal IN2, and a drain electrode connected to the non-inverting output terminal OUTB.

In addition, the fifth P-channel MOS transistor MP5 has a source electrode supplied with the switching signal IN2, a gate electrode which is connected to the drain electrode (the second node #2) of the second N-channel MOS transistor MN2 and a drain electrode of the sixth P-channel MOS transistor MP6, and a drain electrode connected to the drain electrode (the first node #1) of the first N-channel MOS transistor MN1. The sixth P-channel MOS transistor MP6 has a source electrode supplied with the switching signal IN2, a gate electrode which is connected to the drain electrode (the first node #1) of the first N-channel MOS transistor MN1 and the drain electrode of the fifth P-channel MOS transistor MP5, and a drain electrode connected to the drain electrode (the second node #2) of the second N-channel MOS transistor MN2. That is, the fifth and the sixth P-channel MOS transistors MP5 and MP6 have the gate electrodes connected to the drain electrodes of the sixth and the fifth P-channel MOS transistors MP6 and MP5 in a cross fashion.

In addition, in FIG. 2, a node, which is a connection between the drain electrode of the first P-channel MOS transistor MP1 and the source electrode of the third P-channel MOS transistor MP3, is indicated by "A001" while another node, which is another connection between the drain electrode of the second P-channel MOS transistor MP2 and the source electrode of the fourth P-channel MOS transistor MP4, is indicted by "B001".

Providing with the third and the fourth P-channel MOS transistors MP3 and MP4 each having the gate electrode connected to the grounding terminal GND is to take action for breakdown voltages BVds between the drain and the source electrodes of the first and the second P-channel MOS transistors MP1 and MP2. The breakdown voltage BVds is determined as follows. For example, a case of the N-channel MOS transistor is as follows. A drain voltage is risen with both of a source voltage and a gate voltage put into a zero voltage. When a drain current is measured at this time, the drain current flows gradually and then drastically flows at a particular voltage. The particular voltage where the drain current drastically flows (the voltage at which the drain current exceeds a predetermined current value) is called a drain-to-source breakdown voltage BVds or is merely called the breakdown voltage BVds.

It will now be assumed that the input signal IN1 has a logic high level "H" (IN1="H"). In this event, the node A001 is put into a floating state. As a result, a potential difference between the N-well substrate and the drain electrode of the third P-channel MOS transistor MP3 becomes |0 V|+|VNEG|. It will be presumed that the power supply voltage VCC is equal to 5 V and the level shift variable voltage NVEG is equal to −12 V. Under the circumstances, the potential difference becomes 12 V and it is therefore possible to ease stress to which the third P-channel MOS transistor MP3 is put. In the first P-channel MOS transistor MP1 connected to the third P-channel MOS transistor MP3, a potential difference between the gate electrode and the drain electrode becomes |0 V|+|VCC| and is similar to operation at a normal CMOS level. That is, the third P-channel MOS transistor MP3 serves as a first breakdown preventing arrangement for preventing the first P-channel MOS transistor MP1 from breaking down.

This holds for the fourth P-channel MOS transistor MP4 and the second P-channel MOS transistor MP2 connected thereto. That is, the fourth P-channel MOS transistor MP4 serves as a second breakdown preventing arrangement for preventing the second P-channel MOS transistor MP2 from breaking down.

Figure 3A:
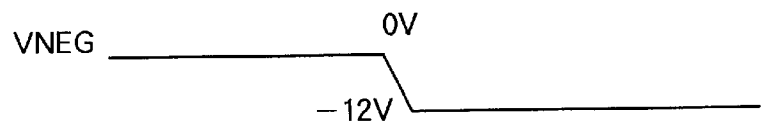
FIGS. 3A through 3E show a time chart for use in describing operation of the level shifter circuit illustrated in FIG. 2.
Figure 3B:
Figure 3C:
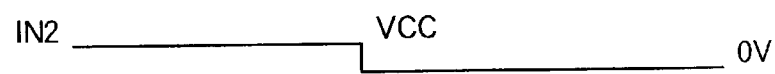
Figure 3D:
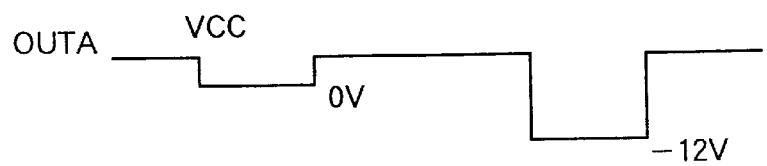
Figure 3E:
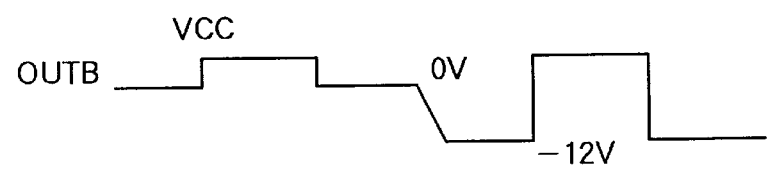

Referring to FIGS. 3A through 3E, this holds for the third and the fourth N-channel MOS transistors MN3 and MN4 each having the gate electrode connected to the switching terminal IN2. FIG. 3A shows the level shift variable voltage VNEG. FIG. 3B shows the input signal IN1 while FIG. 3C shows the switching signal IN2. FIG. 3D shows the inverting output signal OUTA while FIG. 3E shows the non-inverting output signal OUTB.

As shown FIGS. 3A and 3C, the switching signal IN2 has a logic high level "H" (IN2="H") when the level shift variable voltage VNEG is equal to a zero voltage (VNEG= "GND"). The switching signal IN2 has a logic low level "L" (IN2="L") when the level shift variable voltage VNEG is equal to a "negative voltage".

It will be assumed that the level shift variable voltage VNEG is equal to the "negative voltage". Attention will be directed to the second N-channel MOS transistor MN2. Inasmuch as the fourth N-channel MOS transistor MN4 has the gate electrode supplied with the switching signal IN2 of the logic low level "L", a potential difference between the P-well substrate and the drain electrode becomes |0 V|+|VNEG|. Attention will be directed to the first N-channel MOS transistor MN1. A potential difference between the gate electrode and the substrate |0 V|+|VNEG|.

It will be presumed that the power supply voltage VCC is equal to 5 V and the level shift variable voltage VNEG is equal to the negative voltage of −12 V. Under the circumstances, the potential difference between the gate electrode and the substrate becomes a potential difference of 12 V and it is therefore possible to prevent the gate electrodes of the first and the second N-channel MOS transistors MN1 and MN2 from destroying. In other words, the third N-channel MOS transistor MN3 acts as a first gate destruction preventing arrangement for preventing the gate electrode of the first N-channel MOS transistor MN1 from destroying while the fourth N-channel MOS transistor MN4 is operable as a second gate destruction preventing arrangement for preventing the gate electrode of the second N-channel MOS transistor MN2 from destroying.

Attention will be directed to the fifth and the sixth P-channel MOS transistors MP5 and MP6 in a case where the level shift variable voltage VNEG is equal to the zero voltage (VNRG="GND").

It will be assumed that the fifth and the sixth P-channel MOS transistors MP5 and MP6 are absent. In addition, as illustrated in FIG. 2, a connection between the drain electrode of the first N-channel MOS transistor MN1 and the source electrode of the third N-channel MOS transistor MN3 is the first node #1 while another connection between the drain electrode of the second N-channel MOS transistor MN2 and the source electrode of the fourth N-channel MOS transistor MN4 is the second node #2. In this event, because of presence of the third and the fourth N-channel MOS transistors MN3 and MN4 for protection, the first and the second nodes #1 and #2 have potentials as described hereunder. That is, the potential of the first node #1 drops out by the third N-channel MOS transistor MN3 by one step and has a value obtained by dividing resistors of the first and the third N-channel MOS transistors MN1 and MN3. On the other hand, the potential of the second node #2 drops out by the fourth N-channel MOS transistor MN4 by one step and has a value obtained by dividing resistors of the second and the fourth N-channel MOS transistors MN2 and MN4. Accordingly, the potentials of the first and the second nodes #1 and #2 are low and it is impossible to quickly decide ON/OFF of the N-channel MOS transistors. Therefore, use of the fifth and the sixth P-channel MOS transistors MP5 and MP6 help to lift the potentials up to the power supply voltage VCC. As a result, the fifth and the sixth P-channel MOS transistors MP5 and MP6 scheme to speed up signal switching by quickly deciding VNEG/GND or VCC/GND. That is, a combination of the fifth and the sixth P-channel MOS transistors MP5 and MP6 serves as an accelerating arrangement for accelerating a switching speed for signals.

However, the conventional level shifter circuit illustrated in FIG. 2 causes problem as follows. When the power supply voltage VCC is a low voltage, for example, of 3 V, the problem arises because a signal switching for the inverted and the non-inverted output signals OUTA and OUTB does not occur in the level shifter circuit although a switching of the input signal IN1 is carried out. This occurs when the level shift variable voltage VNEG is equal to the grounding potential (VNEG="GND") and the switching signal has the logic high level (IN2="H").

This is because, in order to prevent the transistors from destroying, the level shifter circuit is provided with third and the fourth N-channel MOS transistors MN3 and MN4 each of which has the gate electrode connected to the switching terminal IN2. More specifically, it will be assumed that the power supply voltage VCC is the low voltage with the level shift variable voltage VNEG="GND" and with the switching signal IN2="H". Under the circumstances, for example, when the input signal IN1="H", the potential of the second node #2 drops out by the fourth N-channel MOS transistor MN4 by one step and is determined by dividing resistors of the second and the fourth N-channel MOS transistors MN2 and MN4, as described above. As a result, it is impossible to turn the fifth P-channel MOS transistor MP5 off because the potential of the second node #2 does not lift up to a voltage more than a threshold voltage of the fifth P-channel MOS transistor MP5 in an initial state. In the similar manner to a case of the input signal IN1="L", it is impossible to turn the sixth P-channel MOS transistor MP6 off. In this event, it is impossible to function as the level shifter circuit, as mentioned in the preamble of the instant specification.

Figure 4:
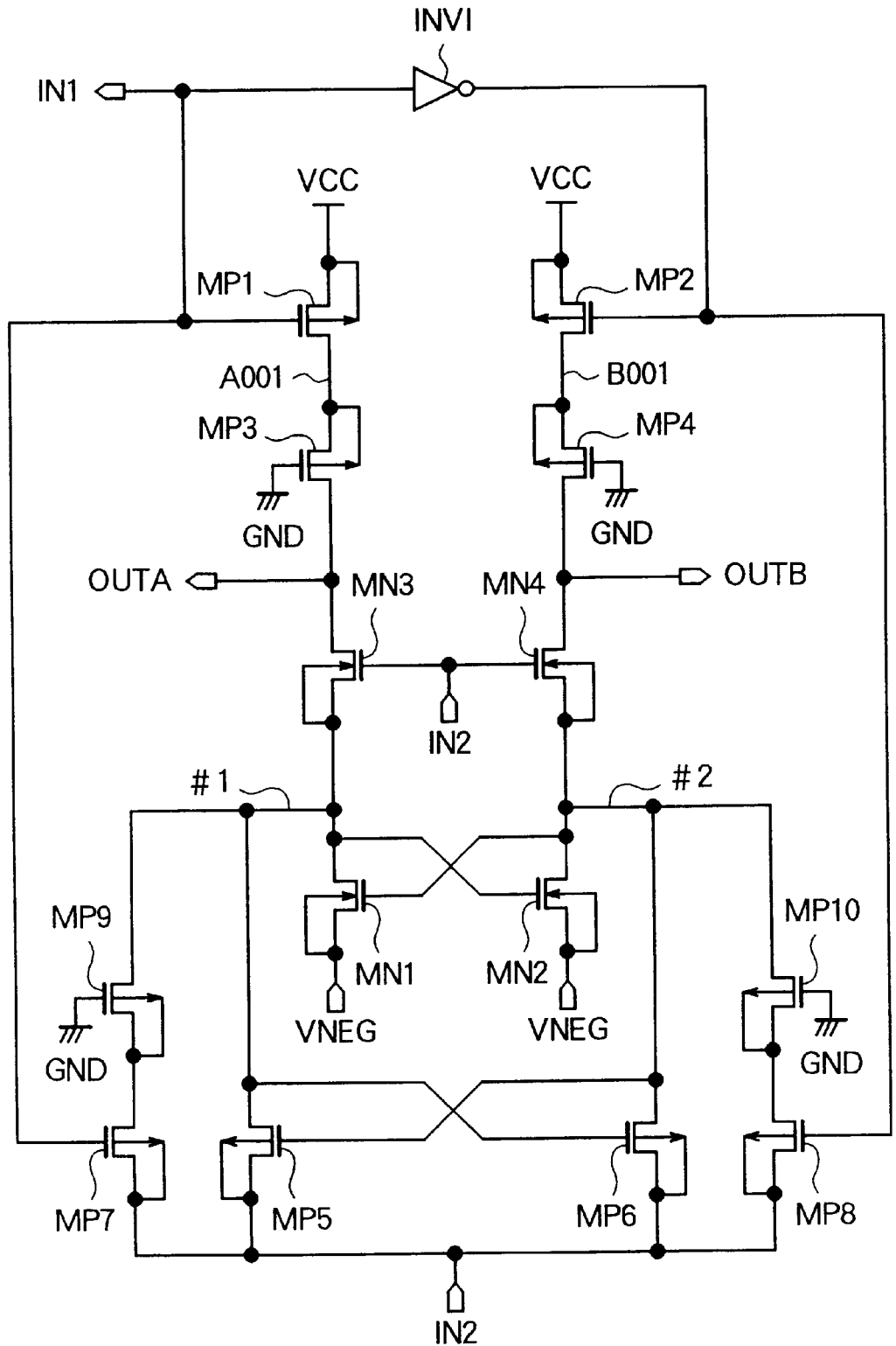
FIG. 4 is a circuit diagram of a level shifter circuit according to a first embodiment of the instant invention.

Referring to FIG. 4, the description will proceed to a level shifter circuit according to a first embodiment of this invention. The level shifter circuit is similar in structure and operation to the conventional level shifter circuit illustrated in FIG. 2 except that the level shifter circuit further comprises seventh through tenth P-channel MOS transistors MP7, MP8, MP9, and MP10. Therefore, the same reference symbols are affixed to those having the similar functions as shown in FIG. 2 and description therefor will be omitted for simplification of the description.

The seventh P-channel MOS transistor MP7 has a gate electrode connected to the input terminal IN1, a source electrode connected to the switching terminal IN2, and a drain electrode connected to a source electrode of the ninth P-channel MOS transistor MP9. Likewise, the eighth P-channel MOS transistor MP8 has a gate electrode connected to the output terminal of the inverter INV1, a source electrode connected to the switching terminal IN2, and a drain electrode connected to a source electrode of the tenth P-channel MOS transistor MP10. In addition, the ninth P-channel MOS transistor MP9 has a gate electrode connected to the grounding terminal GND and a drain electrode connected to the first node #1. The tenth P-channel MOS transistor MP10 has a gate electrode connected to the grounding terminal GND and a drain electrode connected to the second node #2.

Turning to FIGS. 3A through 3E, description will be made about operation of the level shifter circuit illustrated in FIG. 4.

Attention will be directed at first to a first state where the input signal IN1 has the logic high level (IN1="H"). In this event, the eighth P-channel MOS transistor MP8 is turned on, the first N-channel MOS transistor MN1 is turned on, the third N-channel MOS transistor MN3 is turned on, the first P-channel MOS transistor MP1 is turned off, the inverted output signal OUTA is equal to the level shift variable voltage VNEG, the seventh P-channel MOS transistor MP7 is turned off, the second N-channel MOS transistor MN2 is turned off, the fourth N-channel MOS transistor MN4 is turned on, the second P-channel MOS transistor MP2 is turned on, and the non-inverted output signal OUTB is equal to the power supply voltage VCC.

Now, attention will be directed to a second state where the input signal IN2 has the logic low level (IN1="L"). In this event, the eighth P-channel MOS transistor MP8 is turned off, the first N-channel MOS transistor MN1 is turned off, the third N-channel MOS transistor MN3 is turned on, the first P-channel MOS transistor MP1 is turned on, the inverted output signal OUTA is equal to the power supply voltage VCC, the seventh P-channel MOS transistor MP7 is turned on, the second N-channel MOS transistor MN2 is turned on, the fourth N-channel MOS transistor MN4 is turned on, the second P-channel MOS transistor MP2 is turned on, and the non-inverted output signal OUTB is equal to the level shift variable voltage VNEG.

In each of the first and the second states, the switching signal IN2 is equal to the logic high level "H" when the level shift variable voltage VNEG is equal to the grounding voltage "GND" while the switching signal IN2 is equal to the logic low level "L" when the level shift variable voltage VEEG is equal to the "negative voltage". Where the level shift variable voltage VNEG=the "negative voltage" indicates between the grounding potential GND or the zero voltage and the predetermined negative voltage. In addition, a timing where the switching signal IN2 turns from the logic high level "H" to the logic low level "L" is required that the level shift variable voltage VNEG has at least a value of the negative voltage which is larger than two times the threshold voltage of the N-channel MOS transistor. For instance, it will be assumed that the threshold voltage of the N-channel MOS transistor is equal to 1 V. In this event, the switching signal IN2 is turned from the logic high level "H" to the logic low level "L" when the level shift variable voltage VNEG is equal to about −4 V which is more than at least −2 V. This is because the N-channel MOS transistor having the gate electrode supplied with the switching signal IN2 is not turned to an OFF-state.

In the conventional level shifter circuit illustrated in FIG. 2, as described above, the potentials of the first and the second nodes #1 and #2 is decided by dropping the N-channel MOS transistor by one step and by resistor dividing the N-channel MOS transistors connected in series. This is because the third and the fourth N-channel MOS transistors MN3 and MN4 are present.

In contrast with this, in the first embodiment, inasmuch as two new added P-channel MOS transistors, namely, the seventh and the eighth P-channel MOS transistors MP7 and MP8 have the gate electrodes which are directly supplied with the input signal IN1 and the inverted input signal, respectively, it is possible to certainly transmit a level of the power supply voltage VCC or the grounding potential GND to the first and the second nodes #1 and #2. This is because it is possible to transmit the level of the power supply voltage VCC as it is to the first and the second nodes #1 and #2 with making nothing of one step dropping of the threshold voltage Vt in the N-channel transistor because each transistor of MP7, MP8, MP9, and MP10 is the P-channel transistor.

As described above, a combination of the seventh and the ninth P-channel MOS transistors MP7 and MP9 is connected to the input terminal IN1, the switching terminal IN2, and the first node #1 and serves as a first node potential fixing arrangement for fixing a potential of the first node #1. Similarly, a combination of the eighth and the tenth P-channel MOS transistors MP8 and MP10 is connected to the input terminal of the inverter INV1, the switching terminal IN2, and the second node #2 and acts as a second node potential fixing arrangement for fixing a potential of the second node #2.

In addition, the level shifter circuit is provided with the ninth and tenth P-channel MOS transistors MP9 and MP10 each of which has the gate electrode connected to the grounding terminal GND. This is because the same reason that the level shifter circuit is provided with the third and the fourth P-channel MOS transistors MP3 and MP4 and the ninth and the tenth P-channel MOS transistors MP9 and MP10 are to take action for breakdown voltages BVds between the drain and the source electrodes of the seventh and the eighth P-channel MOS transistors MP7 and MP8, respectively. In other words, the ninth P-channel MOS transistor MP9 is operable as a first additional breakdown preventing arrangement for preventing the seventh P-channel MOS transistor MP7 from breaking down while the tenth P-channel MOS transistor MP10 is operable as a second additional breakdown preventing arrangement for preventing the eighth P-channel MOS transistor MP8 from breaking down.

Figure 5:
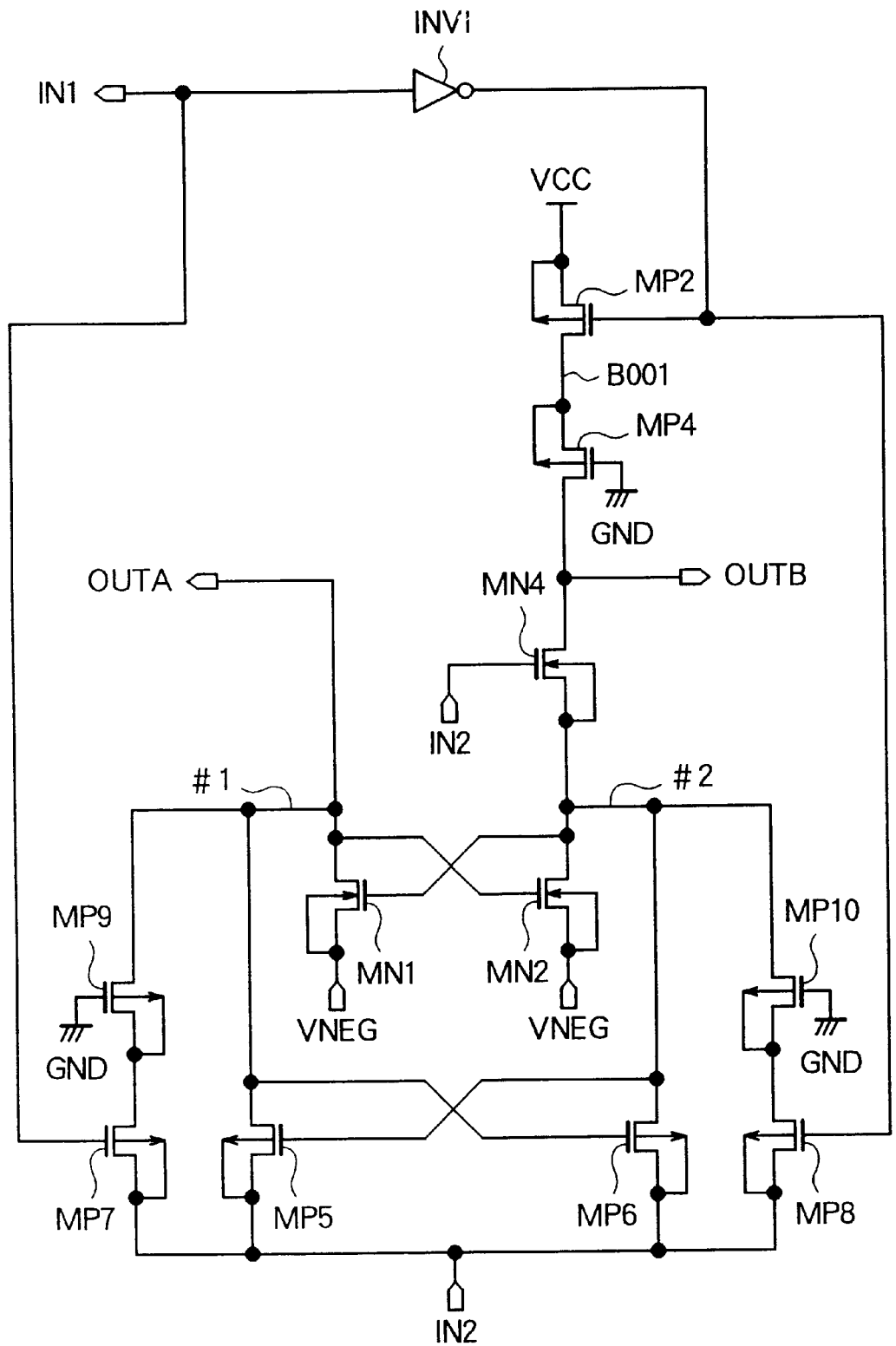
FIG. 5 is a circuit diagram of a level shifter circuit according to a second embodiment of the instant invention.

Referring to FIG. 5, the description will proceed to a level shifter circuit according to a second embodiment of this invention. The illustrated level shifter circuit is similar in structure and operation to the level shifter circuit illustrated in FIG. 4 except that the first P-channel MOS transistor MP1, the third P-channel MOS transistor MP3 serving as the first breakdown preventing arrangement, and the third N-channel MOS transistor MN3 acting as the first gate destruction preventing arrangement are omitted from the level shifter circuit illustrated in FIG. 4 and the first node #1 is directly connected to the inverting output terminal OUTA.

The second embodiment is implemented on the premise that a level switching is not carried out when the level shift variable voltage VNEG is equal to the "negative voltage". An input value of the input signal IN1 is determined when the level shift variable voltage VNEG is equal to the grounding potential "GND" and thereafter the level shift variable voltage VNEG is pulled down to the negative voltage.

The inverting output terminal OUTA produces either the level shift variable voltage VNEG or a value of the switching signal IN2 while the non-inverting output terminal OUTB produces either the level shift variable voltage VNEG or the power supply voltage VCC.

This is effective in a case where it does not make the inverting output terminal OUTA to produce the power supply voltage VCC when the level shift variable voltage VNEG is equal to the negative voltage. For instance, the inverting output terminal OUTA can be used as a gate input of a transfer gate comprising an N-channel MOS transistor having a source electrode supplied with the level shift variable voltage VNEG="−12 V". If the inverting output terminal OUTA produces the power supply voltage VCC="3 V", stress of 15 V is applied between the gate electrode and the substrate of the transistor and a gate withstand voltage does not wear. The second embodiment is effective on transmitting such a negative voltage.

Figure 6:
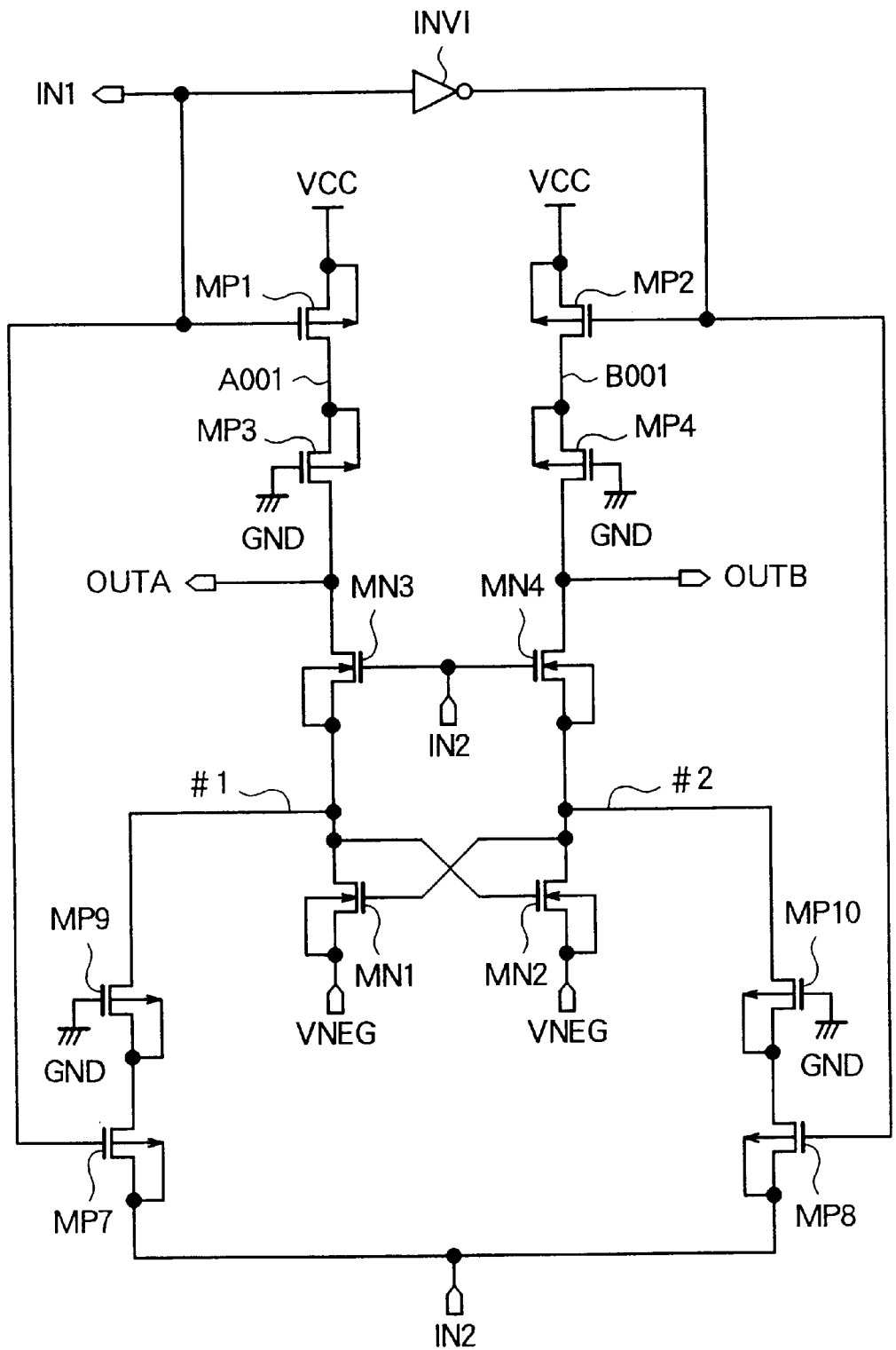
FIG. 6 is a circuit diagram of a level shifter circuit according to a third embodiment of the instant invention.

Referring to FIG. 6, the description will proceed to a level shifter circuit according to a third embodiment of this invention. The illustrated level shifter circuit is similar in structure and operation to the level shifter circuit illustrated in FIG. 4 except that the fifth and the sixth P-channel MOS transistors MP5 and MP6 serving as the accelerating arrangement are omitted from the level shifter circuit illustrated in FIG. 4.

When the level shift variable voltage VNEG is equal to the negative voltage, the illustrated level shifter circuit operates with no problem although the power supply voltage VCC is the low voltage for all that an inverting speed is slow a little. Operation of the level shifter circuit is similar to that illustrated in FIG. 4.

Inasmuch as the fifth and the sixth P-channel MOS transistors MP5 and MP6 serving as the accelerating arrangement are absent in the third embodiment, it is possible to reduce a layout area.

Figure 7:
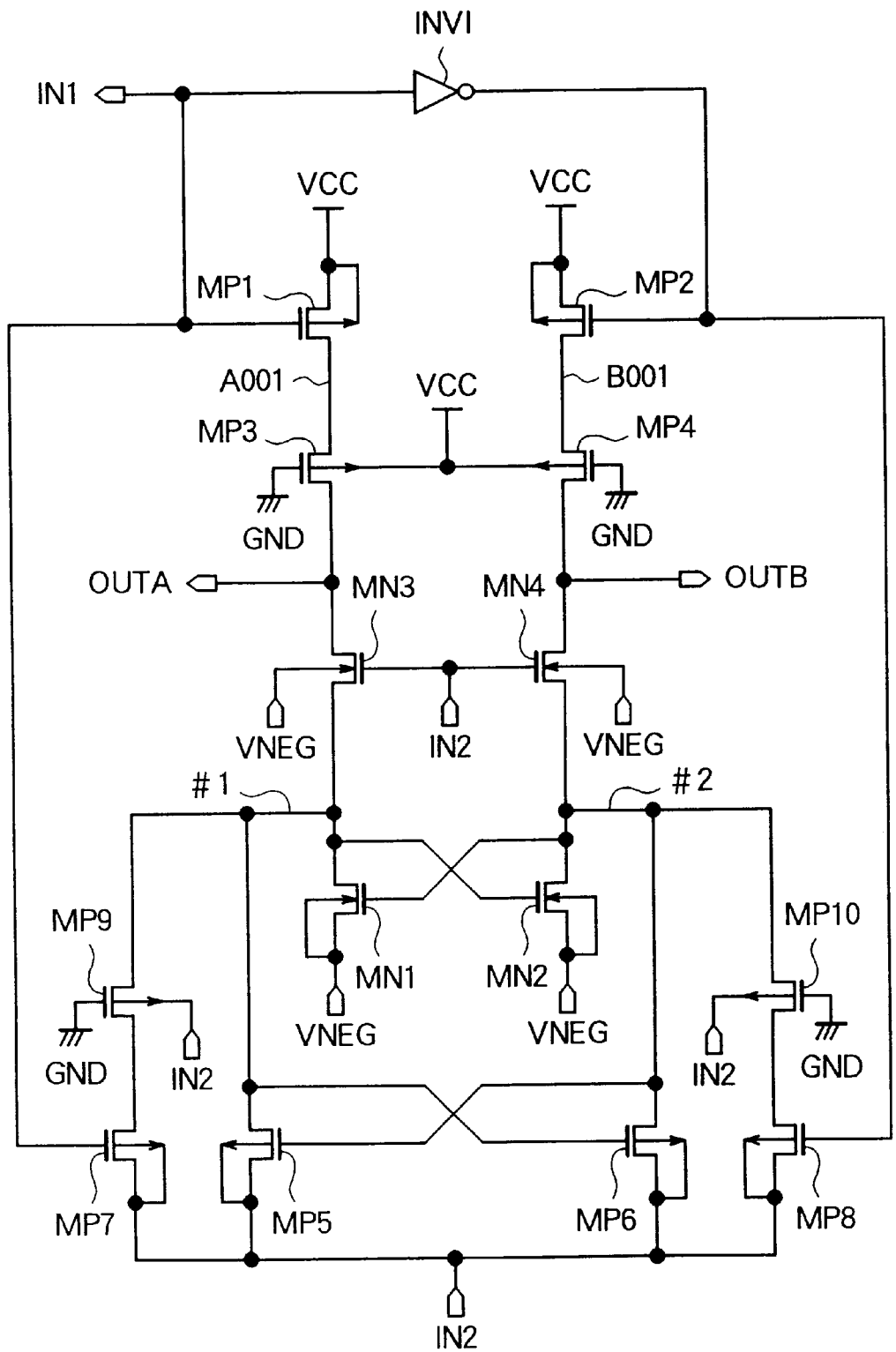
FIG. 7 is a circuit diagram of a level shifter circuit according to a fourth embodiment of the instant invention.
Figure 8:
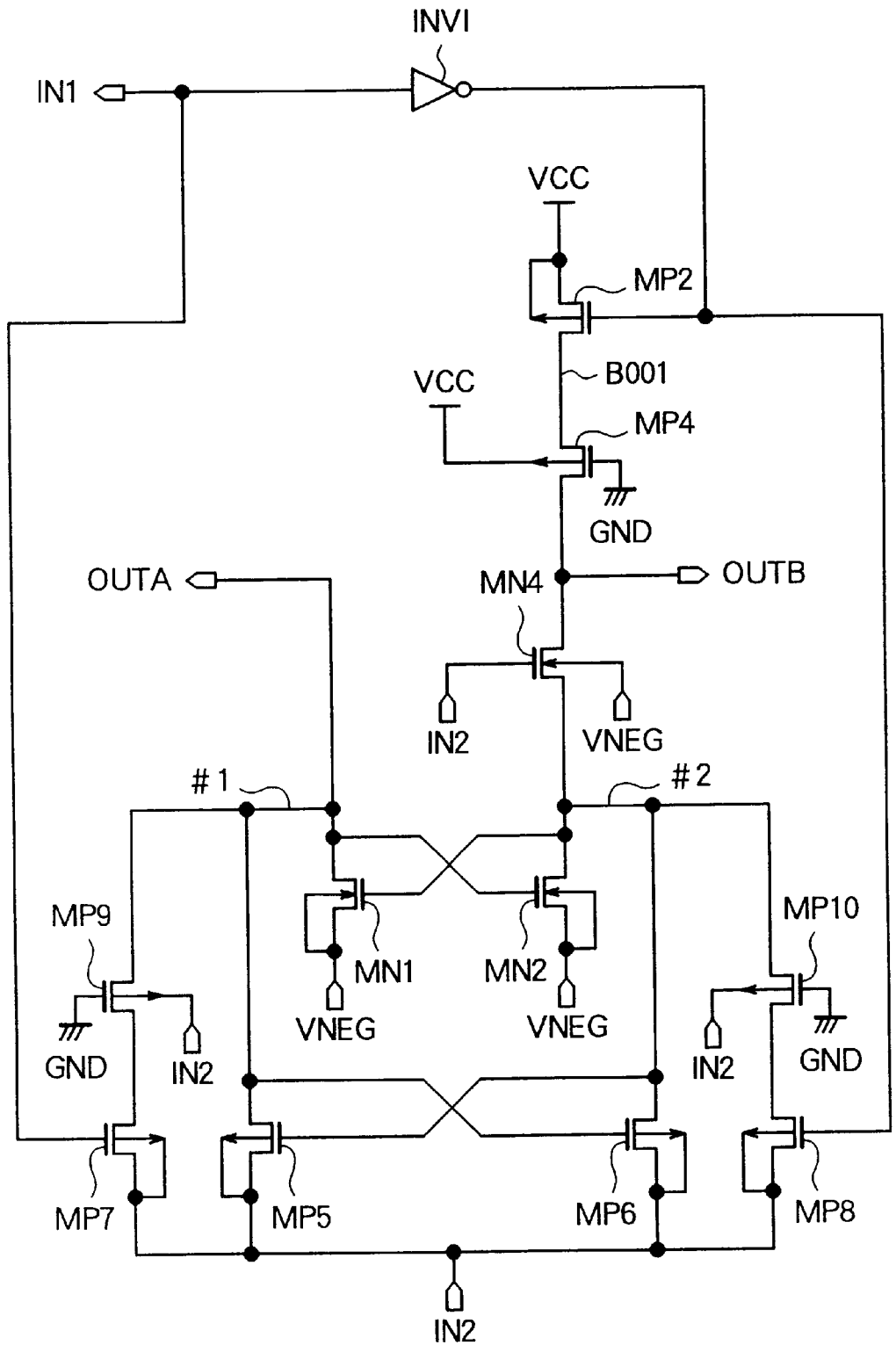
FIG. 8 is a circuit diagram of a level shifter circuit according to a fifth embodiment of the instant invention.
Figure 9:
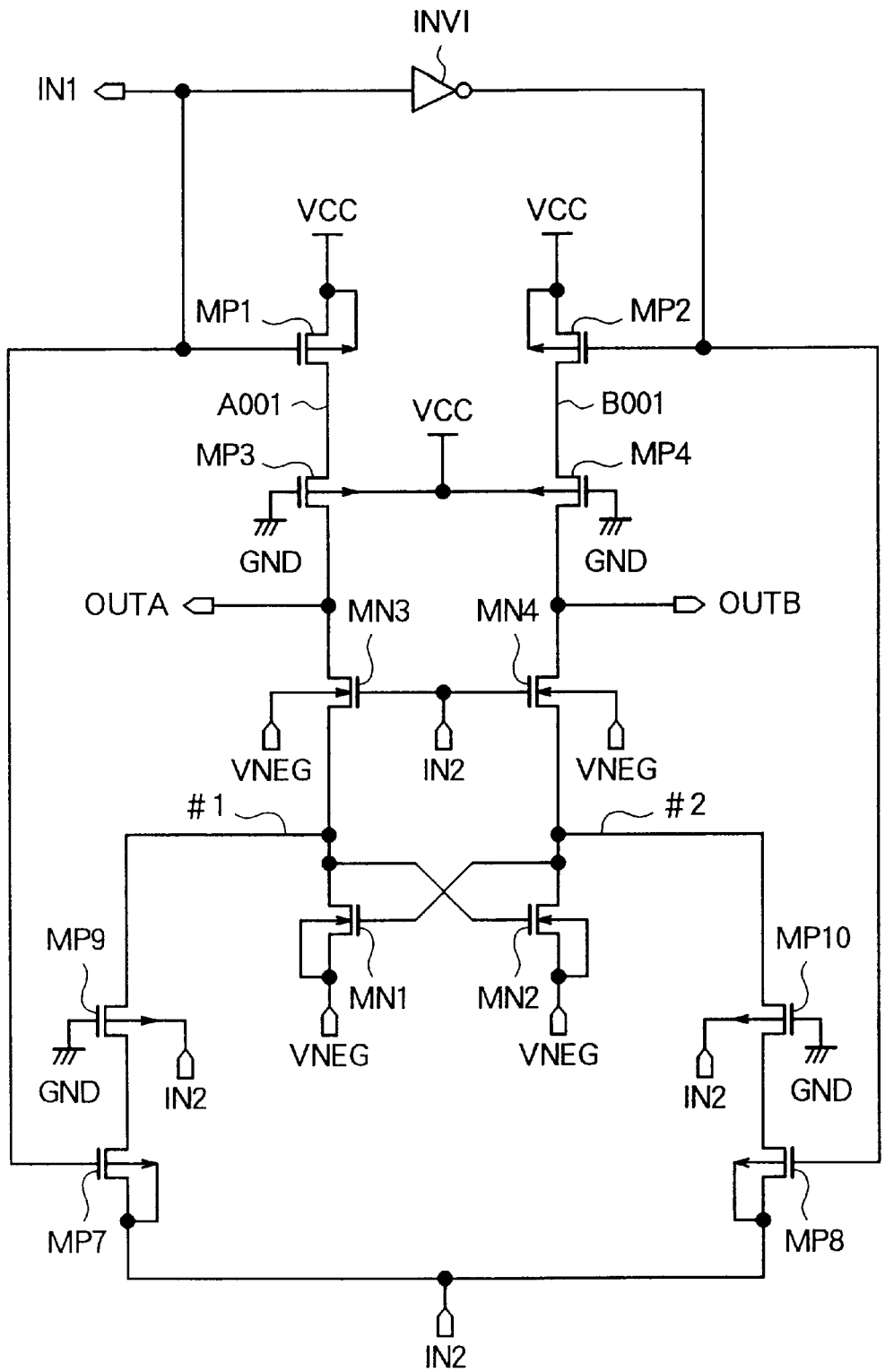
FIG. 9 is a circuit diagram of a level shifter circuit according to a sixth embodiment of the instant invention.

While this invention has thus far been described in conjunction with a few preferred embodiments thereof, it will now be readily possible for those skilled in the art to put this invention into various other manners. For example, the third and the fourth P-channel MOS transistors MP3 and MP4, which are connected in series to the first and the second P-channel MOS transistors MP1 and MP2 connected to the power supply voltage VCC, may have backgate electrodes connected to the power supply voltage VCC as shown in FIGS. 7 through 9 if junction withstand voltages of the transistors may not be taken into account although the third and the fourth P-channel MOS transistors MP3 and MP4 have the backgate electrodes connected to the source electrodes (A001, B001) thereof in the above-mentioned first, second, and third embodiments. As a result, it is possible to reduce the layout area because no well division is required.

In addition, the third and fourth N-channel MOS transistors MN3 and MN4, which are connected in series to the first and the second N-channel MOS transistors MN1 and MN2 connected to the variable voltage terminal VNEG, may have backgate electrodes connected to the variable voltage terminal VNEG as shown in FIGS. 7 through 9 if withstand voltages of the transistors may not be taken into account in the above-mentioned first, second, and third embodiments.

Furthermore, the ninth and the tenth P-channel MOS transistors MP9 and MP10, which are connected in series to the seventh and the eighth P-channel MOS transistors M7 and MP8 connected to the switching terminal IN2, may have backgate electrodes connected to the switching terminal IN2 as shown in FIGS. 7 through 9. With this structure, it is possible to reduce the layout area.

Further, junction field effect transistors (FETs) may be used as the transistors although metal oxide semiconductor (MOS) FETs are used as the transistors in the above-mentioned embodiments.

What is claimed is:

1. A level shifter circuit having an input terminal supplied with an input signal having a low level, a switching terminal supplied with a switching signal, an inverting output terminal for outputting an inverted output signal having inverse phase with the input signal, a non-inverting output terminal for outputting a non-inverted output signal having in phase with the input signal, a power supply terminal supplied with a power supply voltage, and a variable voltage terminal supplied with a level shift variable voltage for varying the low level of the input signal from a zero voltage to a predetermined negative voltage, said level shifter circuit being for carrying out level conversion operation on the input signal in response to the switching signal, said level shifter circuit shifting a low level of the inverted output signal and the non-inverted output signal into the level shift variable voltage when the switching signal indicates a level shift, wherein said level shifter circuit comprises:

an inverter, connected to the input terminal, for inverting the input signal, said inverter having an output terminal for producing an inverted input signal;

a first P-channel transistor having a source electrode connected to the power supply terminal, a gate electrode connected to the input terminal, and a drain electrode;

a second P-channel transistor having a source electrode connected to the power supply terminal, a gate electrode connected to the output terminal of said inverter, and a drain electrode;

a first N-channel transistor having a source electrode connected to the variable voltage terminal, a drain electrode connected to a first node, and a gate electrode connected to a second node;

a second N-channel transistor having a source electrode connected to the variable voltage terminal, a drain electrode connected to the second node, and a gate electrode connected to the first node;

first breakdown preventing means, connected between the drain electrode of said first P-channel transistor and the inverting output terminal, for preventing said first P-channel transistor from breaking down;

second breakdown preventing means, connected between the drain electrode of said second P-channel transistor and the non-inverting output terminal, for preventing said second P-channel transistor from breaking down;

first gate destruction preventing means, connected to the first node, the switching terminal, and the inverting output terminal, for preventing the gate electrode of said first N-channel transistor from destroying;

second gate destruction preventing means, connected to the second node, the switching terminal, and the non-inverting output terminal, for preventing the gate electrode of said second N-channel transistor from destroying;

accelerating means, connected between the first and the second nodes and the switching terminal, for accelerating a switching speed for signals;

first node potential fixing means, connected to the input terminal, the switching terminal, and the first node, for fixing a potential of the first node; and second node potential fixing means, connected to the output terminal of said inverter, the switching terminal, and the second node, for fixing a potential of the second node.

2. A level shifter circuit as claimed in claim 1, wherein:

said first breakdown preventing means consists of a third P-channel transistor having a gate electrode which is grounded, a source electrode connected to the drain electrode of said first P-channel transistor, and a drain electrode connected to the inverting output terminal, said second breakdown preventing means consisting of a fourth P-channel transistor having a gate electrode which is grounded, a source electrode connected to the drain electrode of said second P-channel transistor, and a drain electrode connected to the non-inverting output terminal.

3. A level shifter circuit as claimed in claim 2, wherein said third P-channel transistor has a backgate electrode connected to the power supply terminal and said forth P-channel transistor has a backgate electrode connected to the power supply terminal.

4. A level shifter circuit as claimed in claim 2, wherein:

said first gate destruction preventing means consists of a third N-channel transistor having a gate electrode connected to the switching terminal, a source electrode connected to the first node, and a drain electrode connected to the inverting output terminal, said second gate destruction preventing means consisting of a fourth N-channel transistor having a gate electrode connected to the switching terminal, a source electrode connected to the second node, and a drain electrode connected to the non-inverting output terminal.

5. A level shifter circuit as claimed in claim 4, wherein said third N-channel transistor has a backgate electrode connected to the variable voltage terminal and said fourth N-channel transistor has a backgate electrode connected to the variable voltage terminal.

6. A level shifter circuit as claimed in claim 4, wherein said accelerating means comprises:
   a fifth P-channel transistor having a source electrode connected to the switching terminal, a gate electrode connected to the second node, and a drain electrode connected to the first node; and
   a sixth P-channel transistor having a source electrode connected to the switching terminal, a gate electrode connected to the first node, and a drain electrode connected to the second node.

7. A level shifter circuit as claimed in claim 6, wherein said first node potential fixing means comprises:
   a seventh P-channel transistor having a source electrode connected to the switching terminal, a gate electrode connected to the input terminal, and a drain electrode; and
   first additional breakdown preventing means, connected between the drain electrode of said seventh P-channel transistor and the first node, for preventing said seventh P-channel transistor from breaking down,
   said second node potential fixing means comprising:
      an eighth P-channel transistor having a source electrode connected to the switching terminal, a gate electrode connected to the output terminal of said inverter, and a drain electrode; and
      second additional breakdown preventing means, connected between the drain electrode of said eighth P-channel transistor and the second node, for preventing said eighth P-channel transistor from breaking down.

8. A level shifter circuit as claimed in claim 7, wherein:
   said first additional breakdown preventing means consists of a ninth P-channel transistor having a source electrode connected to the drain electrode of said seventh P-channel transistor, a gate electrode which is grounded, and a drain electrode connected to the first node,
   said second additional breakdown preventing means consisting of a tenth P-channel transistor having a source electrode connected to the drain electrode of said eighth P-channel transistor, a gate electrode which is grounded, and a drain electrode connected to the second node.

9. A level shifter circuit as claimed in claim 8, wherein said ninth P-channel transistor has a backgate electrode connected to the switching terminal and said tenth P-channel transistor has a backgate electrode connected to the switching terminal.

10. A level shifter circuit having an input terminal supplied with an input signal having a low level, a switching terminal supplied with a switching signal, an inverting output terminal for outputting an inverted output signal having inverse phase with the input signal, a non-inverting output terminal for outputting a non-inverted output signal having in phase with the input signal, a power supply terminal supplied with a power supply voltage, and a variable voltage terminal supplied with a level shift variable voltage for varying the low level of the input signal from a zero voltage to a predetermined negative voltage, said level shifter circuit being for carrying out level conversion operation on the input signal in response to the switching signal, said level shifter circuit shifting a low level of the inverted output signal and the non-inverted output signal into the level shift variable voltage when the switching signal indicates a level shift, wherein said level shifter circuit comprises:
   an inverter, connected to the input terminal, for inverting the input signal, said inverter having an output terminal for producing an inverted input signal;
   a first P-channel transistor having a source electrode connected to the power supply terminal, a gate electrode connected to the output terminal of said inverter, and a drain electrode;
   a first N-channel transistor having a source electrode connected to the variable voltage terminal, a drain electrode connected to a first node, and a gate electrode connected to a second node, the first node being directly connected to the inverting output terminal;
   a second N-channel transistor having a source electrode connected to the variable voltage terminal, a drain electrode connected to the second node, and a gate electrode connected to the first node;
   breakdown preventing means, connected between the drain electrode of said first P-channel transistor and the non-inverting output terminal, for preventing said first P-channel transistor from breaking down;
   gate destruction preventing means, connected to the second node, the switching terminal, and the non-inverting output terminal, for preventing the gate electrode of said second N-channel transistor from destroying;
   accelerating means, connected between the first and the second nodes and the switching terminal, for accelerating a switching speed for signals;
   first node potential fixing means, connected to the input terminal, the switching terminal, and the first node, for fixing a potential of the first node; and
   second node potential fixing means, connected to the output terminal of said inverter, the switching terminal, and the second node, for fixing a potential of the second node.

11. A level shifter circuit as claimed in claim 10, wherein said breakdown preventing means consists of a second P-channel transistor having a gate electrode which is grounded, a source electrode connected to the drain electrode of said first P-channel transistor, and a drain electrode connected to the non-inverting output terminal.

12. A level shifter circuit as claimed in claim 11, wherein said second P-channel transistor has a backgate electrode connected to the power supply terminal.

13. A level shifter circuit as claimed in claim 11, wherein said gate destruction preventing means consists of a third N-channel transistor having a gate electrode connected to the switching terminal, a source electrode connected to the second node, and a drain electrode connected to the non-inverting output terminal.

14. A level shifter circuit as claimed in claim 13, wherein said third N-channel transistor has a backgate electrode connected to the variable voltage terminal.

15. A level shifter circuit as claimed in claim 13, wherein said accelerating means comprises:
   a third P-channel transistor having a source electrode connected to the switching terminal, a gate electrode connected to the second node, and a drain electrode connected to the first node; and
   a fourth P-channel transistor having a source electrode connected to the switching terminal, a gate electrode connected to the first node, and a drain electrode connected to the second node.

16. A level shifter circuit as claimed in claim 15, wherein said first node potential fixing means comprises:
- a fifth P-channel transistor having a source electrode connected to the switching terminal, a gate electrode connected to the input terminal, and a drain electrode; and
- first additional breakdown preventing means, connected between the drain electrode of said fifth P-channel transistor and the first node, for preventing said seventh P-channel transistor from breaking down, said second node potential fixing means comprising:
- a sixth P-channel transistor having a source electrode connected to the switching terminal, a gate electrode connected to the output terminal of said inverter, and a drain electrode; and
- second additional breakdown preventing means, connected between the drain electrode of said sixth P-channel transistor and the second node, for preventing said sixth P-channel transistor from breaking down.

17. A level shifter circuit as claimed in claim 16, wherein:
said first additional breakdown preventing means consists of a seventh P-channel transistor having a source electrode connected to the drain electrode of said fifth P-channel transistor, a gate electrode which is grounded, and a drain electrode connected to the first node,
said second additional breakdown preventing means consisting of an eighth P-channel transistor having a source electrode connected to the drain electrode of said sixth P-channel transistor, a gate electrode which is grounded, and a drain electrode connected to the second node.

18. A level shifter circuit as claimed in claim 17, wherein said seventh P-channel transistor has a backgate electrode connected to the switching terminal and said eighth P-channel transistor having a backgate electrode connected to the switching terminal.

19. A level shifter circuit having an input terminal supplied with an input signal having a low level, a switching terminal supplied with a switching signal, an inverting output terminal for outputting an inverted output signal having inverse phase with the input signal, a non-inverting output terminal for outputting a non-inverted output signal having in phase with the input signal, a power supply terminal supplied with a power supply voltage, and a variable voltage terminal supplied with a level shift variable voltage for varying the low level of the input signal from a zero voltage to a predetermined negative voltage, said level shifter circuit being for carrying out level conversion operation on the input signal in response to the switching signal, said level shifter circuit shifting a low level of the inverted output signal and the non-inverted output signal into the level shift variable voltage when the switching signal indicates a level shift, wherein said level shifter circuit comprises:
- an inverter, connected to the input terminal, for inverting the input signal, said inverter having an output terminal for producing an inverted input signal;
- a first P-channel transistor having a source electrode connected to the power supply terminal, a gate electrode connected to the input terminal, and a drain electrode;
- a second P-channel transistor having a source electrode connected to the power supply terminal, a gate electrode connected to the output terminal of said inverter, and a drain electrode;
- a first N-channel transistor having a source electrode connected to the variable voltage terminal, a drain electrode connected to a first node, and a gate electrode connected to a second node;
- a second N-channel transistor having a source electrode connected to the variable voltage terminal, a drain electrode connected to the second node, and a gate electrode connected to the first node;
- first breakdown preventing means, connected between the drain electrode of said first P-channel transistor and the inverting output terminal, for preventing said first P-channel transistor from breaking down;
- second breakdown preventing means, connected between the drain electrode of said second P-channel transistor and the non-inverting output terminal, for preventing said second P-channel transistor from breaking down;
- first gate destruction preventing means, connected to the first node, the switching terminal, and the inverting output terminal, for preventing the gate electrode of said first N-channel transistor from destroying;
- second gate destruction preventing means, connected to the second node, the switching terminal, and the non-inverting output terminal, for preventing the gate electrode of said second N-channel transistor from destroying;
- first node potential fixing means, connected to the input terminal, the switching terminal, and the first node, for fixing a potential of the first node; and
- second node potential fixing means, connected to the output terminal of said inverter, the switching terminal, and the second node, for fixing a potential of the second node.

20. A level shifter circuit as claimed in claim 19, wherein:
said first breakdown preventing means consists of a third P-channel transistor having a gate electrode which is grounded, a source electrode connected to the drain electrode of said first P-channel transistor, and a drain electrode connected to the inverting output terminal,
said second breakdown preventing means consisting of a fourth P-channel transistor having a gate electrode which is grounded, a source electrode connected to the drain electrode of said second P-channel transistor, and a drain electrode connected to the non-inverting output terminal.

21. A level shifter circuit as claimed in claim 20, wherein said third P-channel transistor has a backgate electrode connected to the power supply terminal and said fourth P-channel transistor has a backgate electrode connected to the power supply terminal.

22. A level shifter circuit as claimed in claim 20, wherein:
said first gate destruction preventing means consists of a third N-channel transistor having a gate electrode connected to the switching terminal, a source electrode connected to the first node, and a drain electrode connected to the inverting output terminal,
said second gate destruction preventing means consisting of a fourth N-channel transistor having a gate electrode connected to the switching terminal, a source electrode connected to the second node, and a drain electrode connected to the non-inverting output terminal.

23. A level shifter circuit as claimed in claim 22, wherein said third N-channel transistor has a backgate electrode connected to the variable voltage terminal and said fourth N-channel transistor has a backgate electrode connected to the variable voltage terminal.

24. A level shifter circuit as claimed in claim 22, wherein said first node potential fixing means comprises:

a fifth P-channel transistor having a source electrode connected to the switching terminal, a gate electrode connected to the input terminal, and a drain electrode; and first additional breakdown preventing means, connected between the drain electrode of said fifth P-channel transistor and the first node, for preventing said seventh P-channel transistor from breaking down, said second node potential fixing means comprising:

a sixth P-channel transistor having a source electrode connected to the switching terminal, a gate electrode connected to the output terminal of said inverter, and a drain electrode; and second additional breakdown preventing means, connected between the drain electrode of said sixth P-channel transistor and the second node, for preventing said eighth P-channel transistor from breaking down.

25. A level shifter circuit as claimed in claim 24, wherein:

said first additional breakdown preventing means consists of a seventh P-channel transistor having a source electrode connected to the drain electrode of said fifth P-channel transistor, a gate electrode which is grounded, and a drain electrode connected to the first node, said second additional breakdown preventing means consisting of an eighth P-channel transistor having a source electrode connected to the drain electrode of said sixth P-channel transistor, a gate electrode which is grounded, and a drain electrode connected to the second node.

26. A level shifter circuit as claimed in claim 25, wherein said seventh P-channel transistor has a backgate electrode connected to the switching terminal and said eighth P-channel transistor having a backgate electrode connected to the switching terminal.

\* \* \* \* \*